United States Patent [19]

Blanchard

[11] Patent Number: 5,399,525

[45] Date of Patent: Mar. 21, 1995

[54] PROCESS FOR MANUFACTURING INTEGRATED CIRCUITS WITH VERY NARROW ELECTRODES

[75] Inventor: Pierre Blanchard, Echirolles, France

[73] Assignee: Thomson-CSF Semiconducteurs Specifiques, Puteaux, France

[21] Appl. No.: 30,065

[22] PCT Filed: Jul. 10, 1992

[86] PCT No.: PCT/FR92/00674

§ 371 Date: Mar. 12, 1993

§ 102(e) Date: Mar. 12, 1993

[87] PCT Pub. No.: WO93/02470

PCT Pub. Date: Feb. 4, 1993

[30] Foreign Application Priority Data

Jul. 16, 1991 [FR] France ................. 91 08954

[51] Int. Cl.⁶ .................. H01L 21/441; H01L 21/339
[52] U.S. Cl. ........................ 437/186; 437/53; 148/DIG. 111
[58] Field of Search .......... 437/38, 50, 53, 69, 437/70, 72, 73, 186, 187, 191, 203, 954; 148/DIG. 9, DIG. 35, DIG. 50, DIG. 111

[56] References Cited

U.S. PATENT DOCUMENTS

| | | | |
|---|---|---|---|
| 4,648,941 | 3/1987 | Blanchard | 437/53 |
| 4,692,995 | 9/1987 | Blanchard | 437/233 |
| 4,710,234 | 12/1987 | Blanchard | 437/51 |
| 4,724,218 | 2/1988 | Blanchard et al. | 437/191 |
| 4,753,900 | 6/1988 | Blanchard et al. | 437/53 |
| 4,774,199 | 9/1988 | Blanchard et al. | 437/53 |
| 4,780,394 | 10/1988 | Blanchard et al. | 437/200 |
| 4,873,200 | 10/1989 | Kawakatsu | 437/233 |
| 5,219,768 | 6/1993 | Okita | 437/186 |

FOREIGN PATENT DOCUMENTS

| | | |
|---|---|---|
| 0435257 | 12/1990 | European Pat. Off. . |
| 2535527 | 10/1982 | France . |
| 2637418 | 6/1989 | France . |
| 59-65446 | 4/1984 | Japan ................ 437/72 |
| 2177542 | 7/1985 | United Kingdom . |

OTHER PUBLICATIONS

D. Herault et al., *L'Onde Electrique*, pp. 51–54, "Area Array Image Sensor for HDTV Broadcast Cameras," May/Jun. 1990.

Y. Okita et al., Proceedings of the IEEE 1988 Custom Integrated Circuits Conference, 1988, pp. 22.4.1–22.4.4, "A Novel Base–Emitter Self–Alignment Process for High Speed Bipolar LSIS".

*Electronic Engineering*, Jun. 1986, pp. 9, 10, 14, "New CCD Camera Variants from EEV".

*Primary Examiner*—Brian E. Hearn
*Assistant Examiner*—C. Chaudhari
*Attorney, Agent, or Firm*—Roland Plottel

[57] ABSTRACT

A method for the manufacture of integrated circuits where it is desired to produce narrow conducting grids separated by a narrow gap and uses the lifting-up of silicon nitride (bird's bill) which is formed during a thick localized oxidation. A localized oxidation step is carried out and the oxide formed is totally removed. The edges (20, 22) of a nitride layer (14) stay overhanging. A conforming polycrystalline-silicon deposition enables silicon to be deposited uniformly, including beneath these edges. Finally, vertical anisotropic etching removes the silicon everywhere except beneath the overhanging edges, so that two silicon lines (28, 30) remain. An ion implantation (34) may be performed between the two lines. The method will find particular application for making anti-dazzle systems for photosensitive charge-coupled devices.

14 Claims, 4 Drawing Sheets

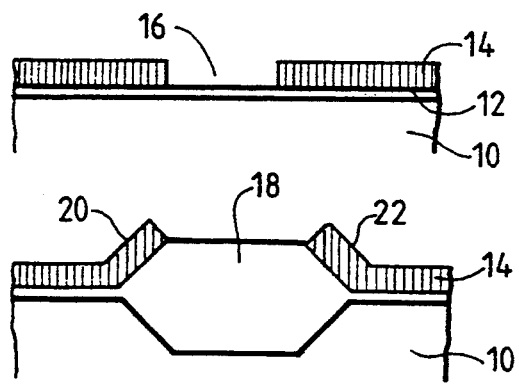
FIG. 1
FIG. 2
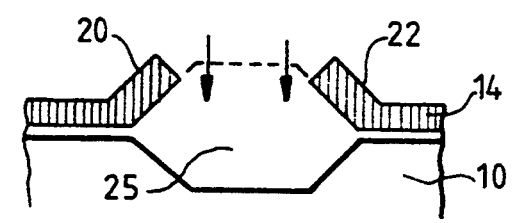
FIG. 3
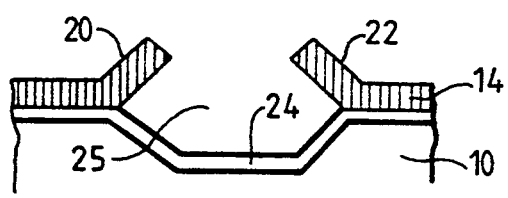
FIG. 4
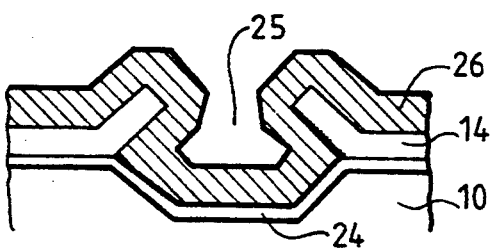
FIG. 5
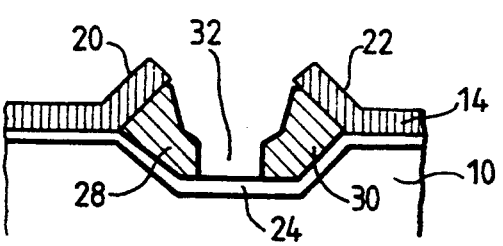
FIG. 6
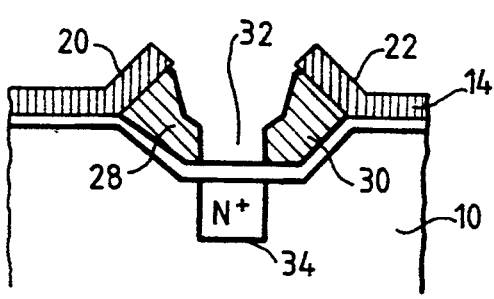
FIG. 7

PROCESS FOR MANUFACTURING INTEGRATED CIRCUITS WITH VERY NARROW ELECTRODES

BACKGROUND OF THE INVENTION

The invention relates to integrated circuits.

In certain applications, and charge-coupled devices may be mentioned by way of example, there is a need to produce very narrow electrodes extending in length on either side of an elongate semiconductor zone. This is the case, for example, for anti-dazzle devices associated with photosensitive charge-coupled devices. Two conducting strips are often produced which are isolated from a semiconductor substrate in which charge transfers take place, these strips flanking an elongate doped semiconductor region formed in the substrate: the doped region serves as a drain for the excess charges and the conducting strips serve to create a potential barrier defining the excess level above which charges have to be drained away in order to prevent dazzling.

In the conventional technique, a polycrystalline-silicon layer is deposited in order to make up the electrodes and it is etched in order to define the semiconductor strips; then a doping impurity is implanted in the gap between two polycrystalline-silicon strips in order to make up the drain in the form of an elongate strip. But conventional photolithography techniques do not then enable the total width necessary for producing the whole unit comprising the two conducting strips separated by a doped semiconductor strip to be reduced below approximately 5 micrometers. Now, it would be preferable to reduce this width to a lower value in order to gain space in the integrated circuit.

This is why the invention provides a novel process for forming conducting strips self-aligned with doped semiconductor strips, the whole unit having a very small width.

According to the invention, a manufacturing process is provided comprising the following steps:
a) a masking layer, preferably made from silicon nitride, is deposited onto the surface of a substrate,
b) this layer is etched in order to define at least one non-masked strip;
c) an opening is formed in the substrate at that place where it is not protected by the masking layer, this opening also extending beneath the edges of the masking layer, leaving these edges overhanging above the opening;
d) some polycrystalline silicon matching the contour of the substrate and of the overhanging edges is deposited;
e) the silicon is removed by etching without a mask so that very narrow silicon strips remain essentially only beneath the overhanging edges.

In other words, the main point of the process according to the invention is the formation of conducting strips, the particular feature of which is that they are located beneath overhanging edges, that is to say their width is defined from the length of overhang of the edges of a masking layer which has served to define an opening in a substrate. The word substrate is taken in the wide sense, as the surface of the substrate can be a semiconductor surface or a semiconductor surface covered with an insulating layer of a certain thickness. And the opening formed in the substrate can be an opening formed in a semiconductor or an opening formed in an insulating layer.

In a particularly advantageous manner, in order to form the opening in the substrate (step c), a localised thick oxidation step (step c1) is used followed by a deoxidation step (step c2). This exploits the fact that thick oxidation steps are provided in any case for other elements of the integrated circuit, but here this step is used in unusual manner since the thick oxide formed is not preserved. The masking layer is then, more precisely, an oxidation-preventing masking layer.

An impurity will be implanted in the substrate if it is desired to define a doped semiconductor region self-aligned with the substrate; depending on the case, this impurity will be implanted before the removal of the thick oxide or after etching of the polycrystalline silicon.

In the case where the two grids adjacent to the doped semiconductor strip have to stay at identical potentials, it is possible to deposit an additional polycrystalline-silicon layer in order to fill the gap between the two grids above the doped semiconductor zone.

In general, the grids will be isolated from the semiconductor substrate by a thin insulating layer formed before deposition of the polycrystalline silicon.

The masking layer can stay or be removed at the end of the manufacturing steps indicated hereinabove.

The etching of the polycrystalline silicon at the end of the process is preferably a vertical anisotropic etching (plasma etching). It is carried out in a uniform manner, that is to say without a mask, at the very least without a mask serving to define the width of the lines to be produced.

In a process variant which is particularly beneficial on account of its compatibility with the manufacture of other circuit elements on the same substrate, the procedure is carried out in the following manner:
starting with a substrate, at least one thick insulating layer is formed on this substrate (in practice this layer is formed by the localised oxidation step which is in any case necessary for the production of the other circuit elements);
a masking layer is deposited for protecting the thick insulating layer from the etching;
the masking layer is etched in order to define a non-masked strip;
the thick insulating layer is etched over its entire thickness in the masked strip and beneath the edges of the masking layer in order to leave these edges overhanging (etching with so-called underetching);
and the previously indicated process is continued: possible formation of a thin insulating layer in the bared zone; deposition of polycrystalline silicon matching the shape of the opening and reaching beneath the overhangs; uniform etching without a mask in order to remove the entire thickness of the polycrystalline silicon in the middle of the opening in which middle it has been deposited, without removing it from beneath the overhangs.

The doping of the substrate, in order to define a doped region between the silicon strips, may be carried out before the deposition of the polycrystalline silicon or after etching of the latter.

BRIEF DESCRIPTION OF THE DRAWINGS

Other characteristics and advantages of the invention will appear on reading the detailed description which follows and which is given with reference to the attached drawings in which:

FIGS. 1 to 7 represent the main steps of a first embodiment of the invention;

DESCRIPTION OF THE PREFERRED EMBODIMENTS

Figure 8:
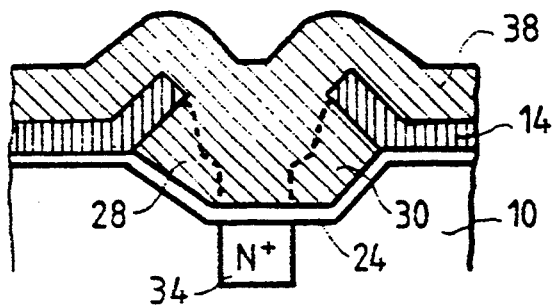
FIGS. 8, 9 and 10 represent a possible continuation of the first embodiment.

The preferred implementation mode according to the invention is that which uses, in order to form an opening with overhanging edges, a thick oxidation step followed by a deoxidation. This process will therefore be described in detail hereinbelow, with a plurality of alternative embodiments.

In a first alternative embodiment of the process according to the invention, the detail of the manufacturing steps may be as follows:

The starting point is a substrate 10 which is, for example, a semiconductor substrate (in practice, silicon). The doping has little significance; it could be a p substrate or a n substrate, or even a p or n substrate covered with an epitaxial layer or with a diffused layer of opposite conductivity type (n or p).

The substrate 10 may also be covered with a thin insulating layer 12, for example made from silicon oxide or silicon nitride or a combination of the two if this is also required in the integrated circuit.

Finally, the substrate may be a single semiconductor layer deposited on another substrate. In any case, in the case of a charge-coupled device, for which the present invention is particularly beneficial, the substrate under consideration here will, in principle, be the semiconductor layer (which may or may not be covered with insulation) in which charge transfers take place.

An oxidation-preventing masking layer 14 is deposited onto the substrate (10 or 10+12). This layer will, in principle, be made from silicon nitride, possibly with interposition of silicon oxide beneath the nitride in order to facilitate the subsequent selective-etching operations.

The layer 14 is photoetched by conventional means in order to define an opening 16 in which the silicon of the substrate will not be protected. The opening can have a width of 1.5 to 2 micrometers approximately.

The structure obtained is shown in FIG. 1.

A deep thermal oxidation operation is then carried out. The silicon oxidises only in the opening 16. In an extremely conventional manner, the oxidation consumes silicon at depth and there is swelling at the surface; the oxide 18 which is produced lifts up the edges (20, 22) of the silicon nitride layer 14. (FIG. 2).

The thick oxide 18 is then removed by chemical deoxidation (FIG. 3). The lifted-up edges (20, 22) of the masking layer 14 stay overhanging, which is very important for the rest of the process. The overhangs project over a few tens of micrometers in length.

If the narrow electrodes which it is desired to produce have to be isolated from the semiconductor substrate, which will most often be the case, a thin insulating layer 24 is then formed in the bottom of the hollowed-out space 25 left free by the deoxidation. The thin insulating layer is preferably formed by thermal oxidation of the silicon. This layer may be from a few tens to a few hundreds of angströms thick. (FIG. 4).

The width of the hollowed-out space is, for example, of the order of 3 micrometers if the starting point is an opening 16 of 1.5 to 2 micrometers and if the thickness of the thick oxide layer was of the order of one micrometer.

A polycrystalline-silicon layer 26, which matches the shape of the irregularities of the surface and which, in particular, reaches right beneath the overhanging edges 20, 22 of the silicon nitride, is then deposited over the entire substrate. A deposition by gas-phase chemical decomposition enables this result to be obtained (FIG. 5).

The thickness of the silicon layer deposited is chosen to be sufficiently small, taking into account the width of the space 25, so as not to fill the whole of the space 25 hollowed out by the deoxidation. A thickness of 0.5 micrometer or less is quite suitable.

The silicon layer 26 is then etched, by vertical anisotropic etching, with a substance which does not etch silicon nitride or which hardly etches it. The silicon disappears, except beneath the overhanging edges 20, 22 of silicon nitride which protect it. The etching is interrupted when the nitride is bared over the whole of the surface of the substrate, that is to say also when the polycrystalline silicon has been removed from the center of the space 25.

There then remain (FIG. 6) two very narrow conducting strips 28 and 30 beneath the overhanging edges 20 and 22, these strips being separated by a free strip 32 in the middle of the space 25 which had been hollowed out during the deoxidation.

Two very narrow conducting strips 28, 30 have thus been produced very close to each other, the gap which separates them being the very narrow gap 32.

The order of magnitude is as follows: width of the conducting strips: approximately 0.5 to 1 micrometer each; gap between them: approximately 1 micrometer.

If it is now desired for these two conducting strips to flank a doped semiconductor strip in the substrate, it is possible to carry out a doping operation by implantation and/or diffusion in the gap 32 between the strips 28 and 30; these strips serve as a mask during this operation.

This is shown in FIG. 7, by way of example: a n+-type impurity, which can serve as a drain for draining away charges in the case of a photosensitive charge-coupled device, has been implanted via the opening 32, masked by the polycrystalline-silicon strips. This results therefore in an anti-dazzle device with two electrodes 28, 30 flanking a narrow drain strip 34, the totality of this device having a width which can be less than 3 micrometers.

In an alternative embodiment, when the two electrodes have to stay systematically at identical potentials, provision may be made for the process to be modified, especially by continuing it by a new deposition of polycrystalline silicon joining the two electrodes. This enables the access resistance of the lines to be reduced. That is what is described with reference to the following figures.

A silicon layer 38 is deposited, preferably by gas-phase chemical decomposition. The deposition thickness is chosen sufficient for the layer 38 to fill the narrow gap 32 and to produce above this gap, on account of the narrowness of the latter, a significant overthickness. (FIG. 8).

A uniform polycrystalline-silicon thickness corresponding to the thickness of the layer 38 deposited is then removed, by chemical etching. The silicon nitride 14 is then once again bared. There remains polycrystalline silicon making up an electrode 40 in the entire space located between the nitride overhangs, that is to say in the space 25 hollowed out after the thick oxidation. This electrode is arranged above a doped strip 34 making up a drain. (FIG. 9).

Figure 9:
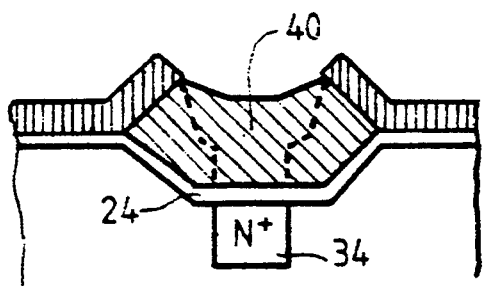

An important point, especially in the case of an antidazzle drain, is the fact that the two electrode portions 28, 30 flanking the doped strip 34 are highly symmetrical, both in the embodiment of FIG. 7 (separated electrodes) and in the embodiment of FIG. 9 (joined electrodes). The process according to the invention enables this symmetry to be obtained.

Figure 10:
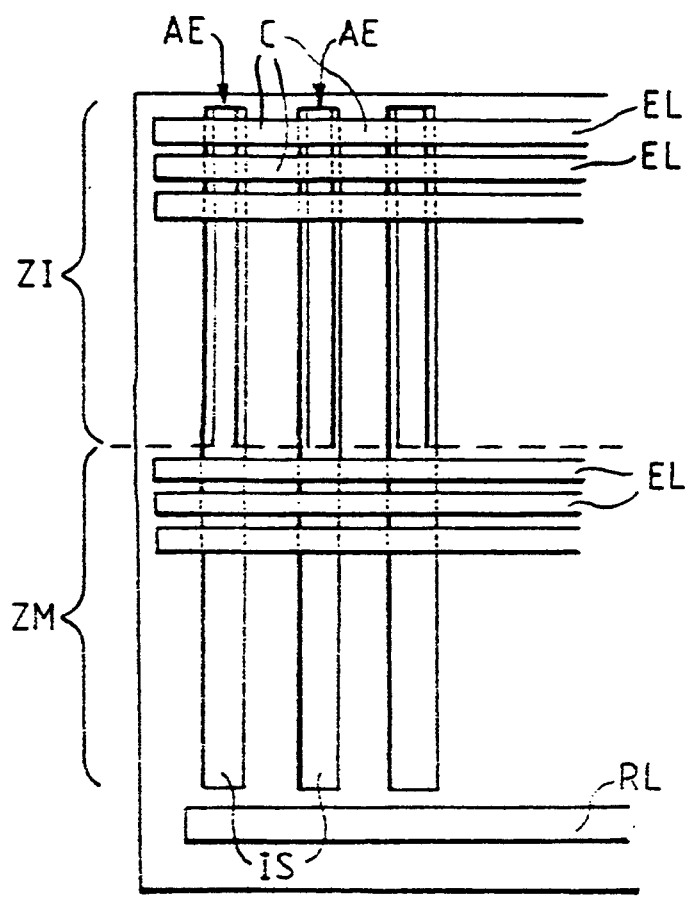

It will be noted that, in particular cases where the electrode 40 has to be at the same potential as the drain 34, or more generally in the case where the invention has to serve to establish a contact connection between a polycrystalline-silicon line and the substrate, it is possible to dispense with the ion implantation step of FIG. 7 and instead to dope the substrate by using the second polycrystalline-silicon layer 38. In this case, after the step of FIG. 6, the thin insulating layer 24 is removed between the electrodes 28 and 30, the latter serving as a mask; then the second silicon layer (the latter being doped or deposited in the presence of a doping impurity) is deposited in the manner indicated hereinabove. The doped silicon is then in contact with the substrate in the gap 32 and it serves as a dopant source in order to form a region 34. This results in a structure similar to that of FIG. 9, but in which the layer 40 is in direct contact with the region 34. (FIG. 10).

In an alternative process embodiment which will now be described with reference to FIGS. 10 to 17, the doping of the line 34 is carried out before the thick oxide 18 is removed, that is to say after the step of FIG. 2.

Figure 11:
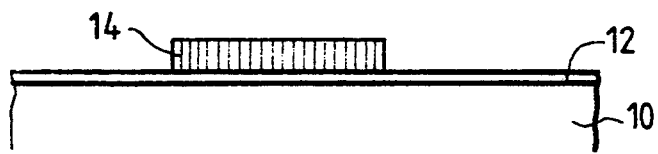
FIGS. 11 to 17 represent the steps of a second embodiment of the invention.

If the starting point once again is a semiconductor substrate 10 which may be made from silicon covered with a thin insulating layer 12, an oxidation-preventing masking layer 14, similar to that which has been described with reference to FIG. 1, is deposited. This layer is etched in order to allow a narrow strip (which could be as little as 1.5 to 2 micrometers wide) of this layer to remain. (FIG. 11).

As a consequence, instead of forming a narrow opening as in FIG. 1, one allows a narrow strip to remain.

Figure 12:
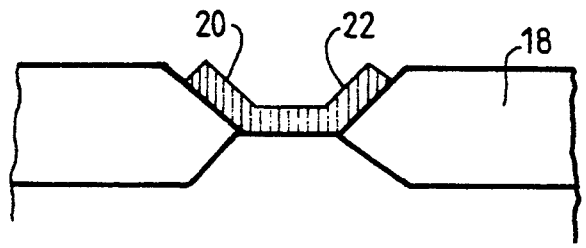

A deep thermal oxidation of the silicon substrate is then carried out. A thick oxide layer 18 is formed, except beneath the masking layer 14. The edges 20 and 22 of the masking layer are lifted up during this oxidation step, on account of the swelling of the oxide layer 18. (FIG. 12).

The impurity, which is to serve for forming the drain 34 on either side of which two conducting strips will subsequently be formed, is then implanted. As a consequence, instead of forming the conducting strips first and then the doped region, one forms the doped region first.

Figure 13:
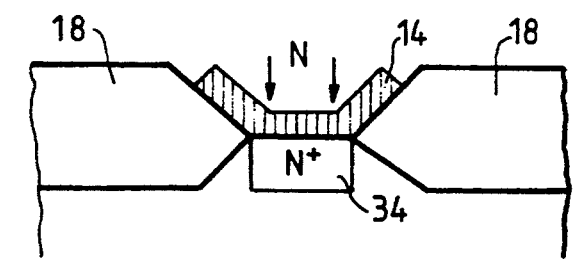

The implantation is performed through the silicon nitride layer; the latter serves in fact as an oxidation-preventing mask but it can be thin enough to allow the implanted impurities to pass if the implantation is performed with a sufficient energy. In this implantation step, it is the thick silicon-oxide layers 18 which will serve as a mask preventing the impurities from penetrating outside the zone located between the raised edges of the masking layer. A doped zone 34 is formed beneath this latter zone. (FIG. 13).

Figure 14:
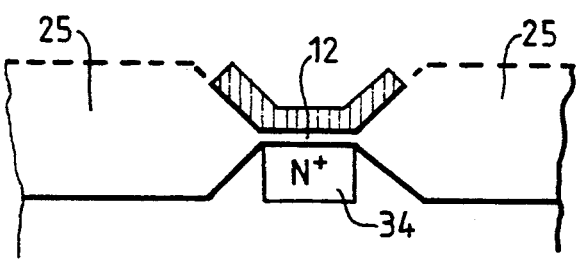

The oxide 18 is then removed by chemical deoxidation, leaving a hollowed-out space 25 on either side of the masking layer 14 and of the doped region 34. The raised edges 20 and 22 of the masking layer stay overhanging above the edges of the hollowed-out space 25. (FIG. 14).

Figure 15:
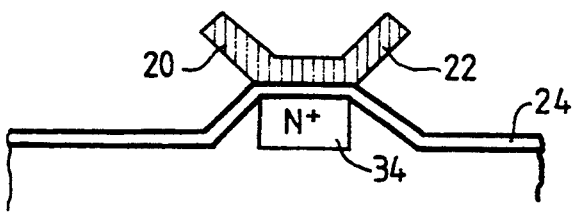

If it is desired that the conducting grids which it is wished to produce be isolated from the substrate 10, a thin insulating layer 24, in principle made from silicon oxide, is then formed by thermal oxidation or by deposition. (FIG. 15).

Figure 16:
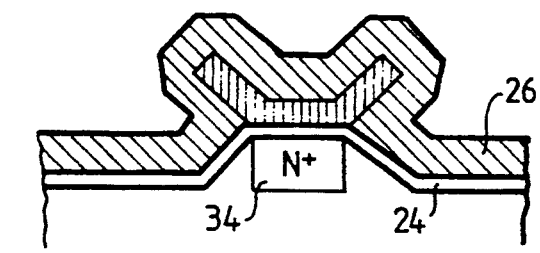
Figure 17:
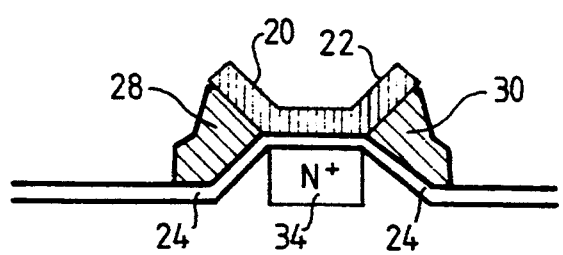
Figure 18:
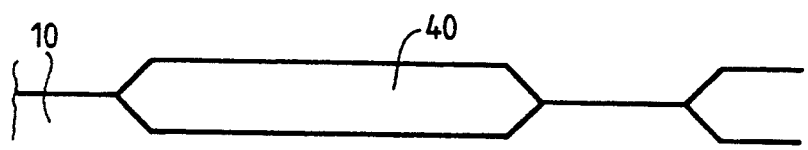
FIGS. 18 to 22 represent another alternative implementation embodiment of the invention.

A polycrystalline-silicon layer 26 is then deposited over the entire surface of the substrate, under deposition conditions such that the deposition follows the contours of the irregularities of the substrate; in particular, it is necessary that the silicon be deposited beneath the overhanging edges 20 and 22 of the masking layer 14. (FIG. 16).

The silicon of the layer 26 is then anisotropically etched, as described with reference to FIG. 6, in order to allow silicon to remain only beneath the overhanging edges 20 and 22. The silicon remaining makes up two very narrow electrodes 28 and 30 flanking a narrow doped region 34 and self-aligned with this doped region. The total width dimensions of the whole unit may be no greater than 2 micrometers.

All the embodiments previously described use a thick oxidation step followed by a deoxidation step in order to form an opening partially covered by overhanging edges. This is, in fact, the most advantageous embodiment. However, a process could also be conceived in which it is not an oxidation-preventing masking layer that is formed but a masking layer preventing the silicon of the substrate from being etched; this layer is etched in order to define a non-protected strip; the substrate is etched in this strip, with underetching beneath the edges of the masking layer. The edges stay overhanging. The remainder of the process, as explained with reference to FIGS. 4 to 10, is carried out: possibly a formation of thin insulation at the bottom of the opening, then a deposition of polycrystalline silicon following the contour of the opening, including beneath the overhanging edges, and then etching of the silicon allowing silicon under the overhangs to remain. In this case, the overhangs are horizontal and not inclined upwards as in the previous figures. It is then conceivable for the etching of the polycrystalline silicon to be (isotropic) chemical etching rather than (vertical anisotropic) plasma etching. In fact, even with chemical etching, some polycrystalline silicon will remain beneath the embankments since the deposition thickness is sufficient with respect to the height of the opening located beneath the overhangs.

Finally, within the same spirit as the previous paragraph, an alternative embodiment of the process, also beneficial, is shown in FIGS. 18 to 22.

The starting point is a substrate 20 which includes at least one superficial semiconductor layer; a thick insulating layer 40 is formed on this substrate. This layer is preferably formed by localised oxidation of the semiconductor since this step is, in any case, necessary for other circuit elements. It is then made from silicon oxide for a silicon substrate.

It is the substrate thus covered which will undergo the steps of the invention: formation of overhangs and then deposition and etching of polycrystalline silicon.

Figure 19:
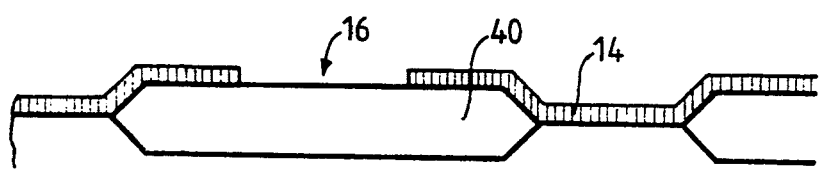

A masking layer 14, preferably made from silicon nitride, is deposited and a strip-shaped opening 16 is defined in this masking layer. The layer will serve as protection in a step for etching the layer 40 (FIG. 19).

Figure 20:
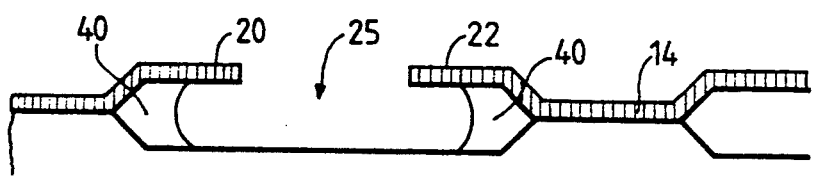

The layer 40 is etched in the strip 16, with chemical etching. The etching is continued until the substrate 10 is bared. During this etching, the silicon oxide is removed from beneath the edges 20, 22 of the masking layer 14 and these edges stay overhanging above an opening 25. The substrate is bared in this opening (FIG. 20).

If the electrodes which it is desired to form have to be isolated from the substrate by a thin insulating layer 24, the latter is then formed, for example by thermal oxidation.

Figure 21:
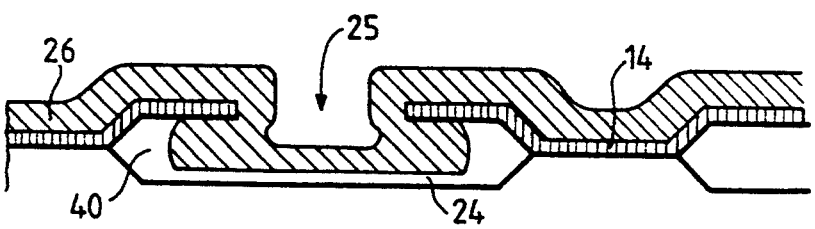

A polycrystalline-silicon layer 26 is next deposited, under low-temperature and low-pressure conditions such that its covering power is high and that it covers the internal edges of the opening 25, including beneath the overhanging edges 20 and 22 (FIG. 21).

The silicon thickness deposited is preferably roughly equal to half the thickness of the layer 40; the latter is, for example, approximately 1 micrometer, so that 5000 angströms of silicon are suitable. The length of the overhangs is approximately equal to the thickness of the layer 40.

Figure 22:
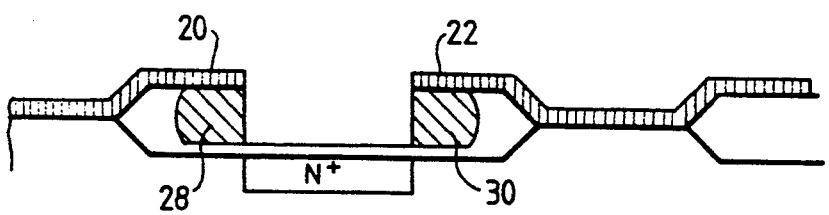

The deposited silicon layer is then etched, preferably by vertical anisotropic etching (plasma etching), in order to allow essentially only conducting strips 28 and 30 located beneath the overhangs 20 and 22 (FIG. 22) to remain. Chemical etching is also conceivable if it allows a sufficient quantity of silicon to remain beneath the overhangs. The result of the plasma etching or of the chemical etching is indicated in FIG. 22.

At this stage, an ion implantation of impurities for doping the substrate may be carried out, as indicated with reference to FIG. 7. However, the alternative embodiments indicated with reference to FIGS. 8 to 10 are also applicable here. Moreover, it would also be conceivable for the implantation to be performed after the step of FIG. 20 (or, respectively, FIG. 4).

One of the advantages of this embodiment of FIGS. 18 to 22 is the presence of a thick lateral insulation on each side of the conducting strips 28 and 39 when such an insulation is required.

I claim:

1. A method for manufacture of an anti-dazzle system for a charge-coupled device, the system having two narrow electrodes that are insulated from a substrate and extend symmetrically on either side of a doped region formed in the substrate and that form a charge removal drain, wherein said method comprises the steps of:
   a) forming a masking layer on a substrate;
   b) etching said layer to define at least one non-protected strip;
   c) forming an opening in the substrate at the place where the substrate is not protected by the masking layer, said opening extending also beneath edges of said opening of the masking layer, and leaving these edges overhanging the opening;
   d) depositing polycrystalline silicon thereon matching a contour of the substrate and the overhanging edges; and
   e) removing the silicon by etching, and without masking, so that narrow silicon strips remain substantially only beneath the overhanging edges.

2. The method according to claim 1, wherein the masking layer is an oxidation-preventing masking layer, and wherein the formation of the opening includes a step for a thick oxidation of the substrate at places where the substrate is unprotected, and further comprising a step for the removal of said thick oxide before said depositing step.

3. The method according to claim 1 or 2, further comprising forming a thin insulating layer on the substrate before depositing the silicon layer.

4. The method according to claim 3, further comprising implanting an impurity in the semiconductor substrate after etching of the silicon, the substrate being masked by the narrow silicon strips.

5. The method according to claim 1 or 2 for making a frame transfer image pick-up matrix comprising a photosensitive image zone with an anti-dazzle system and a frame memory zone, the image zone comprising columns of photosensitive cells, each column being aligned with a respective column of storage zones of the memory zone, said method including a step for the formation of thick silicon oxide in a pattern demarcated by said masking layer, said pattern simultaneously defining, firstly, the location of anti-dazzle devices between the adjacent columns of pixels of the image zone and, secondly, the location of the thick oxide columns between the corresponding adjacent columns of storage zones of the memory zone, and wherein said method steps which form the anti-dazzle system are performed in the image zone but not in the memory zone.

6. The method according to claim 5, wherein an impurity is implanted in the semiconductor substrate after etching of the silicon, the substrate being masked by the narrow silicon strips.

7. The method according to claim 1, wherein said opening in the substrate is formed by localized thick oxidation followed by a step of de-oxidation, and wherein an impurity is implanted in the substrate through the masking layer after the formation of the thick oxide and before removal of this thick oxide, the thick oxide serving as a mask against the implantation of impurities.

8. The method according to claim 7, wherein said masking layer is an oxidation-preventing masking layer.

9. The method according to claim 7 or 8, further forming and comprising a thin insulating layer on the substrate before depositing the silicon layer.

10. The method according to claim 1 or 7, wherein said substrate includes at least one semiconductor material covered with a thick insulating layer, the masking layer is a masking layer to prevent the insulating layer from being etched and the step of etching the substrate includes a step for etching the thick insulating layer, with underetching beneath the edges of the masking layer.

11. The method according to claim 5, wherein said substrate includes at least one semiconductor material covered with a thick insulating layer, the masking layer is a masking layer to prevent the insulating layer from being etched and the step of etching the substrate includes a step for etching the thick insulating layer, with underetching beneath the edges of the masking layer.

12. The method according to claim 1, wherein after etching of the silicon, a second layer of polycrystalline silicon is deposited under conditions suitable for filling the gap between the narrow silicon strips and for forming a thickness of silicon above this gap, and wherein a thickness of polycrystalline silicon at least equal to the finally deposited thickness is then removed uniformly, allowing some silicon to remain between the narrow strips.

13. A method according to claim 1 or 7 or 12, wherein the substrate includes at least one semiconductor material covered with a thick insulating layer, the masking layer is a masking layer to prevent the insulating layer from being etched and the step for etching the substrate includes a step for etching the thick insulating layer, with underetching beneath the edges of the masking layer.

14. A method according to claim 5, wherein the substrate includes at least one semiconductor material covered with a thick insulating layer, the masking layer is a masking layer to prevent the insulating layer from being etched and the step for etching the substrate includes a step for etching the thick insulating layer, with underetching beneath the edges of the masking layer.

* * * * *